United States Patent
Cook et al.

(10) Patent No.: US 10,613,158 B2
(45) Date of Patent: Apr. 7, 2020

(54) EFFICIENT SIGNAL PATH DIAGNOSTICS FOR SAFETY DEVICES

(71) Applicant: Allegro MicroSystems, LLC, Manchester, NH (US)

(72) Inventors: Aaron Cook, Deerfield, NH (US); Virag V. Chaware, Nashua, NH (US); Craig S. Petrie, Merrimack, NH (US)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 191 days.

(21) Appl. No.: 15/782,163

(22) Filed: Oct. 12, 2017

(65) Prior Publication Data
US 2019/0113584 A1    Apr. 18, 2019

(51) Int. Cl.
   *G01R 33/00*    (2006.01)
(52) U.S. Cl.
   CPC .............................. *G01R 33/0035* (2013.01)
(58) Field of Classification Search
   CPC .......... G01R 33/0035; G01R 31/31703; H01L 2924/00; H01L 2924/0002; G01N 33/48721
   USPC ....... 324/329–348, 323, 447, 425, 200, 206, 324/256–259, 600, 637, 639, 658, 202
   See application file for complete search history.

(56) References Cited

U.S. PATENT DOCUMENTS

| | | | |
|---|---|---|---|
| 7,923,996 B2 | 4/2011 | Doogue et al. | |
| 8,169,161 B2 | 5/2012 | Szczeszynski et al. | |
| 8,447,556 B2 | 5/2013 | Friedrich et al. | |
| 8,542,010 B2 | 9/2013 | Cesaretti et al. | |
| 8,680,846 B2 | 3/2014 | Cesaretti et al. | |
| 9,804,222 B2 | 10/2017 | Petrie et al. | |
| 9,804,249 B2 | 10/2017 | Petrie et al. | |
| 2015/0185279 A1 | 7/2015 | Milano et al. | |
| 2015/0185284 A1 | 7/2015 | Milano et al. | |
| 2015/0185293 A1 | 7/2015 | Milano et al. | |
| 2016/0231371 A1* | 8/2016 | Rasbornig | G01R 31/007 |
| 2018/0011140 A1* | 1/2018 | Chaware | G01R 31/2884 |

OTHER PUBLICATIONS

U.S. Appl. No. 15/697,846, filed Sep. 7, 2017, Haas.
U.S. Appl. No. 15/622,459, filed Jun. 14, 2017, Haas et al.

* cited by examiner

*Primary Examiner* — Melissa J Koval
*Assistant Examiner* — Trung Nguyen
(74) *Attorney, Agent, or Firm* — Daly, Crowley, Mofford & Durkee, LLP

(57) ABSTRACT

An apparatus comprises a first measurement circuit having a first magnetic field sensing element to detect a measured magnetic field and produce a first signal representing the measured magnetic field, and a first signal processing circuit to process the first signal to produce a first processed signal. A second measurement circuit comprises a second magnetic field sensing element to detect a measured magnetic field and produce a second signal representing the measured magnetic field, and a second signal processing circuit to process the second signal to produce a second processed signal. A diagnostic processing circuit is coupled to receive the first signal and the second signal and configured to process the first signal during a first time period to produce a first diagnostic signal, and process the second signal during a second time period. A logic circuit determines if an error is present.

17 Claims, 6 Drawing Sheets

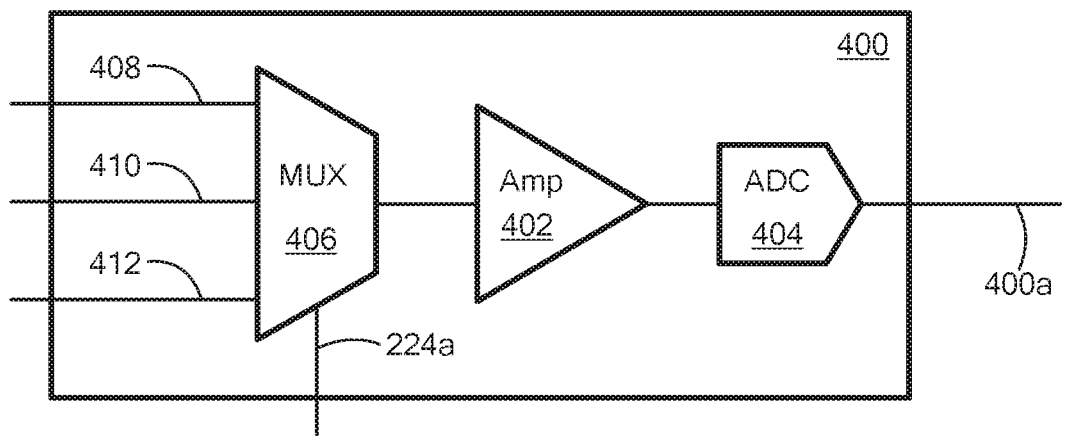
*FIG. 4*
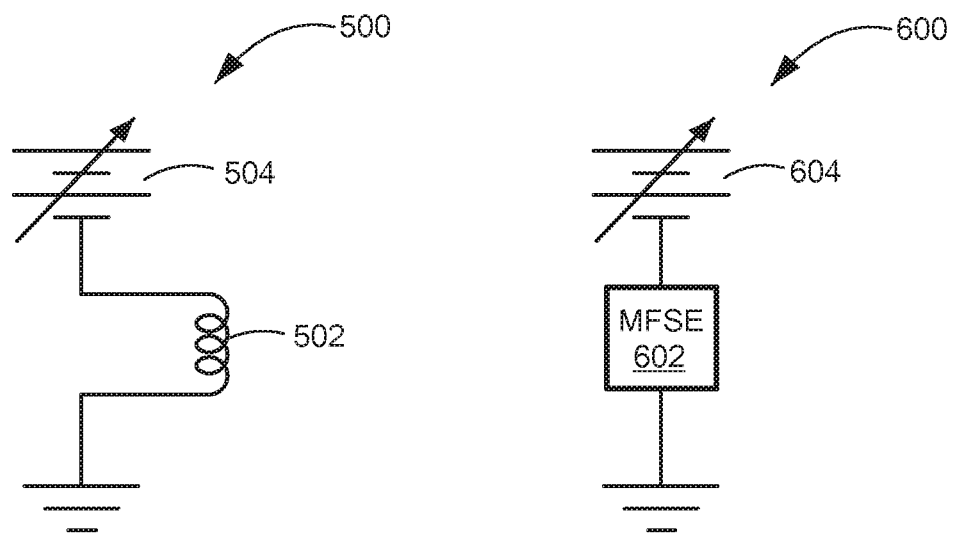
*FIG. 5*    *FIG. 6*

EFFICIENT SIGNAL PATH DIAGNOSTICS FOR SAFETY DEVICES

FIELD

This disclosure relates to magnetic field sensors and, more particularly, to magnetic field sensors having self-diagnostic capability.

BACKGROUND

Magnetic field sensors are often used to detect magnetic targets, or a target that affects a back-bias magnetic field. Such sensors may be used in various applications. For example, in the automotive field, magnetic field sensors may be used to monitor and control anti-lock braking systems, engine control systems, etc.

In fields like automotive, where safety can be critical, magnetic field sensors may be designed to test themselves during operation. For example, to reduce the chance of failure, magnetic field sensors may include diagnostic circuitry to check that the sensor is working properly, redundant circuitry, etc.

SUMMARY

In an embodiment, an apparatus comprises a first measurement circuit comprising a first magnetic field sensing element to detect a measured magnetic field and produce a first signal representing the measured magnetic field, and a first signal processing circuit to process the first signal to produce a first processed signal. A second measurement circuit comprises a second magnetic field sensing element to detect a measured magnetic field and produce a second signal representing the measured magnetic field, and a second signal processing circuit to process the second signal to produce a second processed signal. A diagnostic processing circuit is coupled to receive the first signal and the second signal and configured to process the first signal during a first time period to produce a first diagnostic signal, and process the second signal during a second time period to produce a second diagnostic signal. A logic circuit is coupled to receive the first processed signal, the second processed signal, the first diagnostic signal, and the second diagnostic signal to determine if an error is present.

One or more of the following features may be included:

One or more of the first and second magnetic field sensing elements may comprise a Hall effect element or a magnetoresistive element.

The signal processing circuit of the first measurement circuit and/or the signal processing circuit of the second measurement circuit may comprise an amplifier.

The signal processing circuit of the first measurement circuit and the signal processing circuit of the second measurement circuit may each comprise an analog-to-digital converter.

The first signal processing circuit may comprise a first analog-to-digital converter and a first amplifier; the second signal processing circuit may comprise a second analog-to-digital converter and a second amplifier; the diagnostic processing circuit may comprise a diagnostic amplifier and a diagnostic analog-to-digital converter. The first analog-to-digital converter, the second analog-to-digital converter, and the diagnostic analog-to-digital converter each may have the same electrical parameters; and the first amplifier, the second amplifier, and the diagnostic amplifier each may have the same electrical parameters.

The diagnostic processing circuit may include signal processing circuitry and a switch coupled to receive the first signal and the second signal, and selectively direct the first and second signals to signal processing circuitry.

A control circuit may be coupled to the switch and configured to time-multiplex the first signal and the second signal.

One or more diagnostic magnetic field sensing elements to detect the magnetic field and produce a respective diagnostic signal may be included.

A magnetic source to produce the measured magnetic field may be included

The magnetic source may include coil and a coil driver.

In another embodiment, an apparatus comprises two or more measurement circuits each comprising: a magnetic field sensing element to detect a measured magnetic field and produce a signal representing the measured magnetic field; and at least one signal processing circuit to process the measured magnetic field signal. A diagnostic processing circuit may be coupled to receive the signal and generate a diagnostic output. A logic circuit may be coupled to receive an output of each of the measurement circuits and the diagnostic output, and compare the output of each of the measurement circuits to the diagnostic output to determine if a fault is present in a respective measurement circuit.

One or more of the following features may be included:

A coil may be coupled to produce the measured magnetic field.

The diagnostic processing circuit may comprise a diagnostic magnetic field sensing element to detect the measured magnetic field and provide a signal representing the measured magnetic field to the diagnostic processing circuit.

Respective ones of the magnetic field sensing elements of the two or more measurement circuits may be placed so that axes of maximum sensitivity of at least some of the magnetic field sensing elements have different directions.

The different directions may be orthogonal directions.

In another embodiment, a first measurement circuit comprises a first magnetic field sensing element to detect a measured magnetic field and produce a first signal representing the measured magnetic field and at least one signal processing circuit to process the first signal. A second measurement circuit comprises a second magnetic field sensing element to detect a measured magnetic field and produce a second signal representing the measured magnetic field and at least one signal processing circuit to process the second signal. Means for producing a diagnostic signal based on the measurement magnetic field may be included. Means for comparing the first and second signals to the diagnostic signal to determine whether a fault exists may be included.

Means for time multiplexing the first signal and the second signal for delivery to a diagnostic circuit may also be included.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 4 is a block diagram of a diagnostic processing circuit.

FIG. 5 is a circuit diagram of a coil and driver circuit.

FIG. 6 is a circuit diagram of a magnetic field sensing element and driver circuit.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
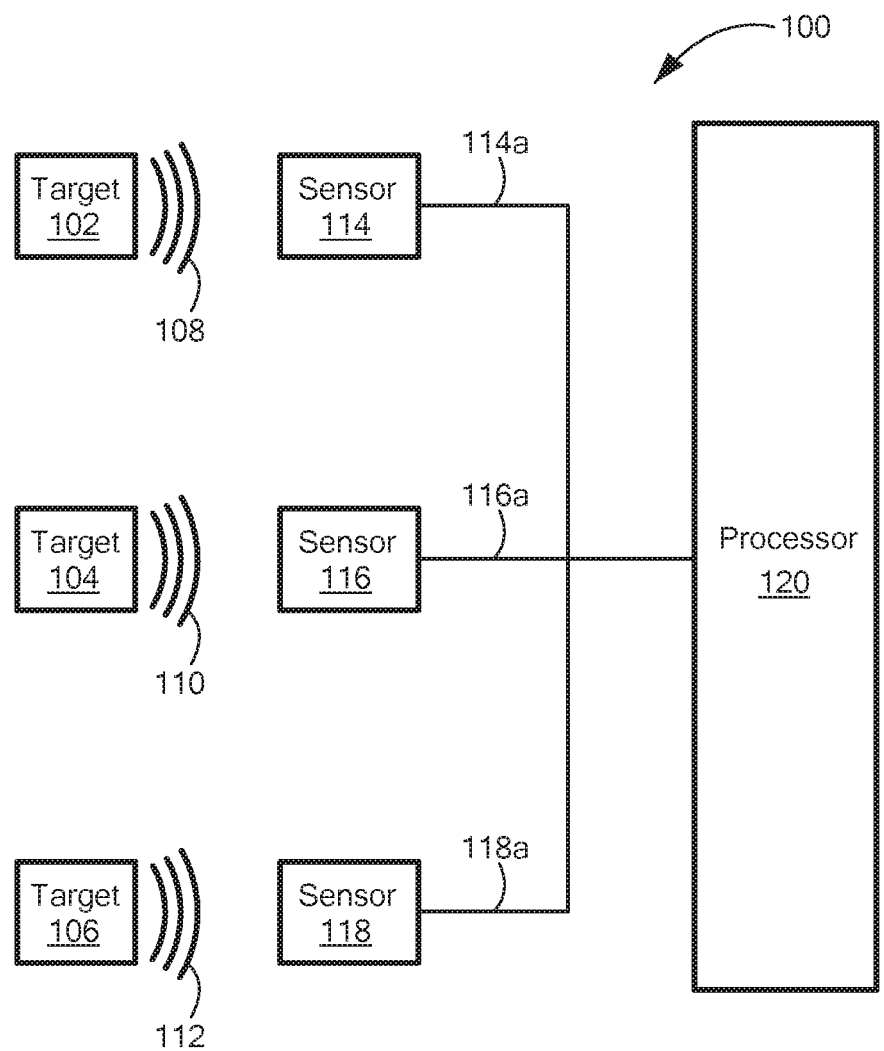
FIG. 1 is a block diagram of a system for measuring magnetic fields.

FIG. 1 is a block diagram of a system 100 for detecting one or more targets 102, 104, 106. Targets 102, 104, 106 may be magnetic targets that directly produce magnetic field 108, 110, 112, respectively. In other embodiments, one or more of targets 102, 104, 106 may be a non-magnetic target. In this example, a coil or other magnetic source may produce the magnetic field 108, 110, or 112, and movement of the target through the magnetic field may cause variations in the magnetic field that can be detected.

System 100 may include one or more magnetic field sensors 114, 116, 118 configured to detect magnetic fields 108, 110, 112, respectively. Magnetic field sensors 108, 110, 112 may detect the respective magnetic field and produce a respective signal 114a, 116a, 118a representing strength of the magnetic field, speed, angle, direction of rotation and/or position of the respective target, etc.

Processor 120 may receive signals 114a, 116a, and 118a, process the signals, and/or make decisions based on the signals. Processor may be a general purpose or custom processor that executes software instructions, a custom circuit, or any other device that can receive and process signals 114a-118a.

In embodiments, sensors 114-118 (and/or processor 120) may be supported by one substrate (e.g. semiconductor substrate) or by multiple substrates. Sensors 114-118 may also be encapsulated in a single electronic package, or in multiple electronic packages.

System 100 or similar systems may be employed in any number of fields and applications. For example, sensors 114-118 may be automotive sensors. Targets 102-106 may be coupled to a vehicle's anti-lock braking system and processor 120 may be an automotive processor that controls the vehicle's anti-lock braking system. As the vehicle operates, magnetic field sensors 114-118 may detect motion of targets 102-106, and encode and transmit information about the targets as signals 114a-118a. Processor 120 may receive signals 114a-118a, which may be used to control the anti-lock braking system by, for example, engaging or disengaging the vehicle's brakes.

Although three magnetic field sensors 114-118 are shown, system 100 may include any number of magnetic field sensors.

Figure 2:
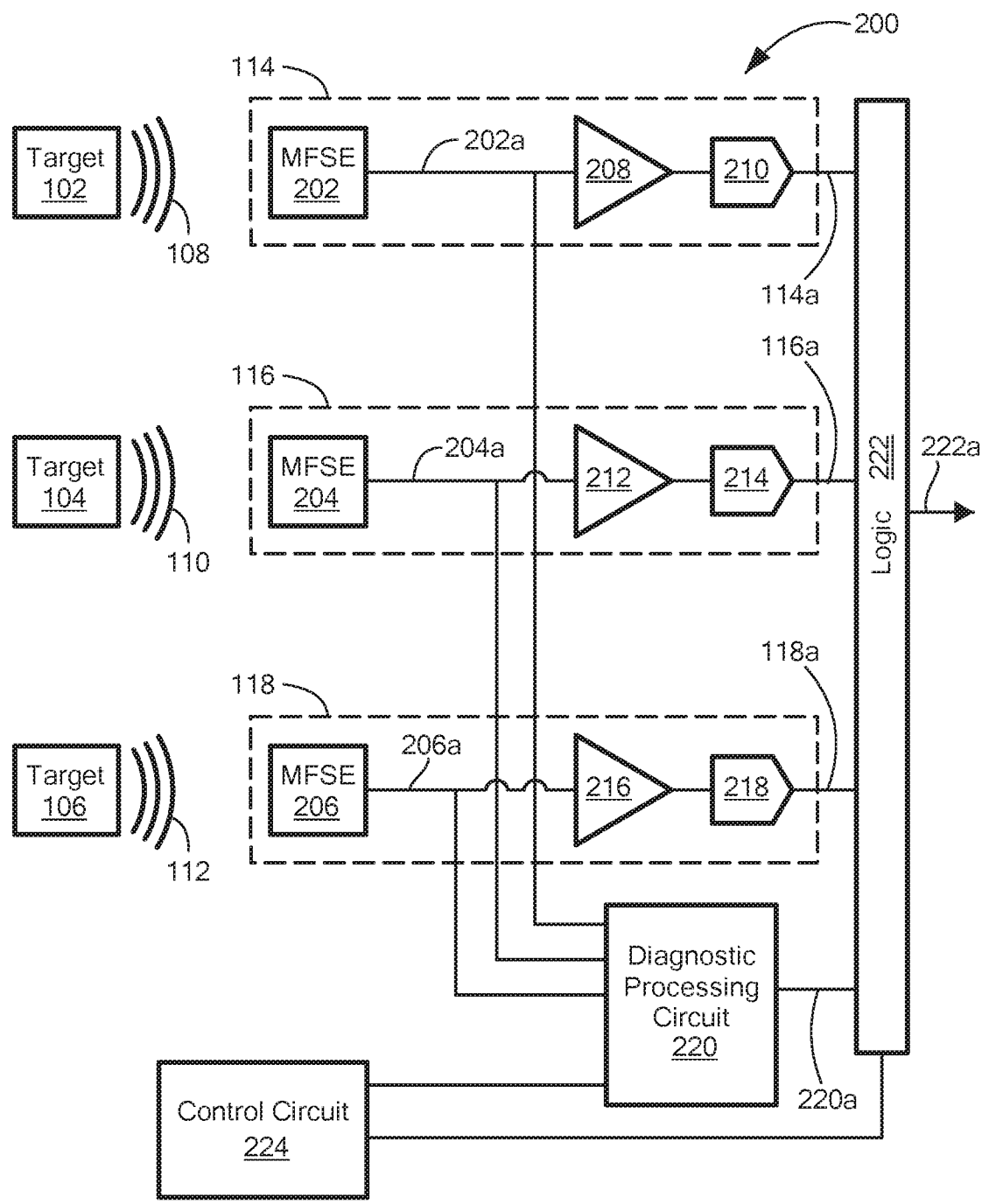
FIG. 2 is a block diagram of an embodiment of the system of FIG. 1.

Referring to FIG. 2, system 200 may include magnetic field sensing elements 202, 204, 206 configured to detect magnetic fields 108-112, respectively, and produce a respective signal 202a-206a representing the respective magnetic field. Each magnetic field sensor 114-118 may comprise a respective magnetic field sensing element 202, 204, 206. Magnetic field sensing elements 202, 204, 206 may include Hall effect elements, magnetoresistance elements, or a combination of Hall effect and magnetoresistance elements.

In embodiments, magnetic field sensing elements 202, 204, and 206 may be placed so that their axes of maximum sensitivity have different directions. In some embodiments, the axes of maximum sensitivity of magnetic field sensing elements 202, 204, and 206 may be orthogonal to each other. This may allow for magnetic field sensing elements 202, 204, and 206 to detect magnetic fields in three dimensions.

Each magnetic field sensor 114-118 may include a signal processing path to process signals 202a-206a. The signal processing path of magnetic field sensor 114 may comprise amplifier 208 and analog-to-digital converter (ADC) 210 for processing signal 202a. Although not shown, the signal processing path of magnetic field sensor 114 may include other circuit components for processing signal 202a. Similarly, the signal processing path of magnetic field sensor 116 may comprise amplifier 212 and analog-to-digital converter 214 for processing signal 204a. Although not shown, the signal processing path of magnetic field sensor 116 may include other circuit components for processing signal 204a. The signal processing path of magnetic field sensor 118 may comprise amplifier 216 and analog-to-digital converter 218 for processing signal 206a. Although not shown, the signal processing path of magnetic field sensor 118 may include other circuit components for processing signal 206a. The other circuit components may be chopping circuits, filters, or any other type of circuit element to process the signals from the magnetic field sensing elements.

In embodiments, the circuit elements comprising the signal processing paths of magnetic field sensors 114, 116, and 118 may be formed by the same manufacturing process so that the circuit parameters of magnetic field sensors 114, 116, and 118 are substantially the same. For example, amplifiers 208, 212, and 216 may be formed by the same manufacturing (e.g. fabrication) process so they have the same circuit characteristics. Likewise, for other components in the signal processing paths.

After processing the signals 202a-206a, each magnetic field sensor 114, 116, 118 may provide a respective processed signal 114a, 116a, 118a as an output.

System 200 may also comprise a diagnostic processing circuit 220, which may be coupled to receive signals 202a-206a and process signals 202a-206a in a manner similar to the signal processing paths of magnetic field sensors 114, 116, and 118. Diagnostic processing circuit 220 may process signals 202a-206a and produce output signal 220a. Since diagnostic processing circuit 220 processes signals 202a-206a in a manner similar to the magnetic field sensors, signal 220a may match one or more of signals 114a, 116a, or 118a. In an embodiment, diagnostic processing circuit 220 processes signals 202a, 204a, and 206a in a time division multiplexed manner. Thus, signal 220a may be a time division multiplexed signal that matches signal 114a during one time period, matches signal 116a during another time period, and matches signal 118a during another time period. Diagnostic processing circuit 220 will be discussed in further detail below.

System 200 may also include a logic circuit 222 coupled to receive signals 114a, 116a, and 118a, and also receive time division multiplexed signal 220a. Logic circuit 222 may compare signal 220a to signal 114a during one time period, compare signal 220a to signal 116a during another time period, and compare signal 220a to signal 118a during another time period. Logic circuit 222 may produce an output signal 222a indicating whether the compared signals match. If the compared signals do not match, signal 222a may indicate an error. Logic circuit 222 will be discussed in further detail below.

System 200 may also comprise a control circuit 224 coupled to diagnostic processing circuit 220 and logic circuit 222. Control circuit 224 may implement a state machine (or other control mechanism) to control diagnostic processing circuit 220 and/or logic circuit 222 to implement the time division multiplex scheme and comparison of the signals.

Figure 3:
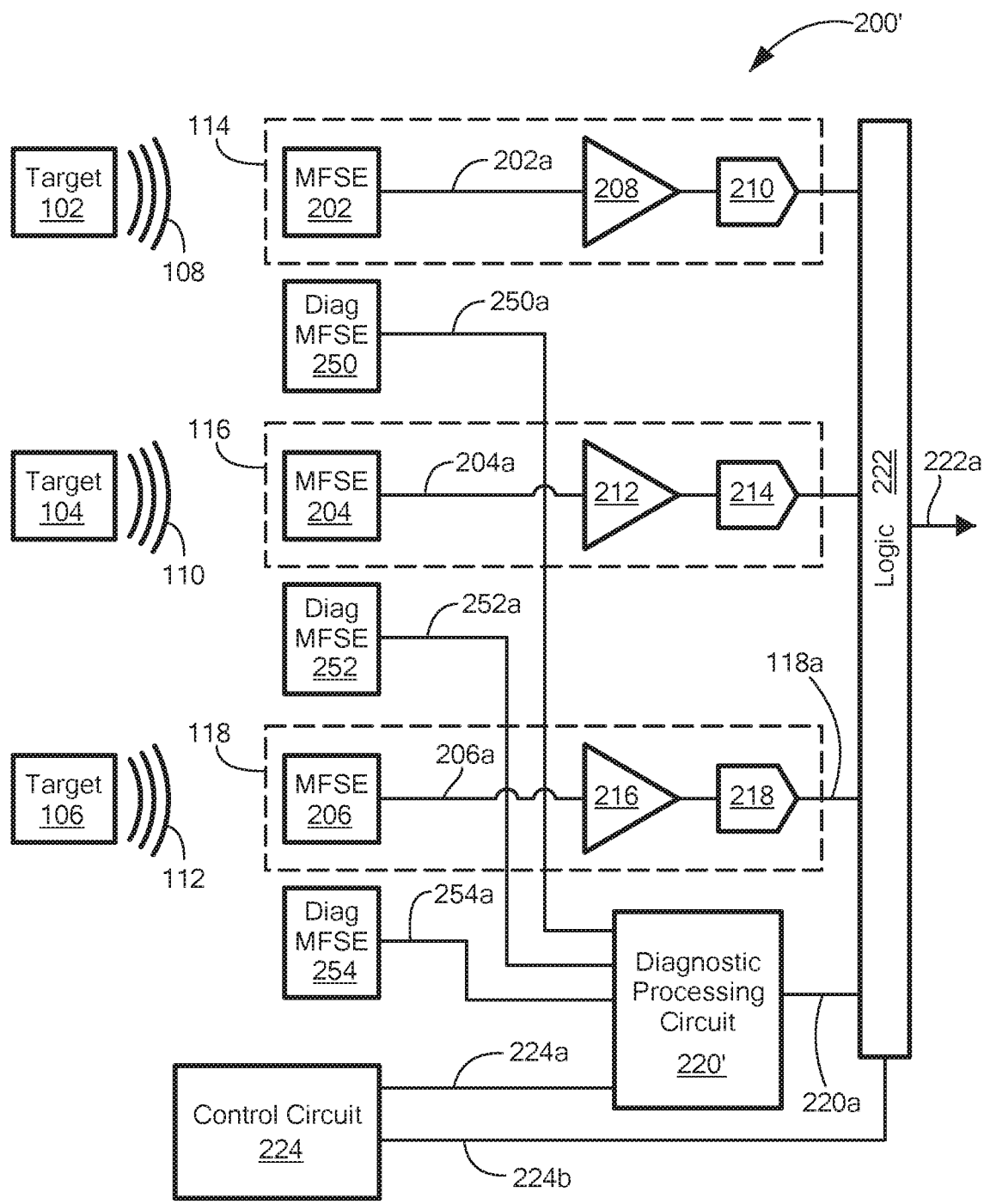
FIG. 3 is a block diagram of an embodiment of the system of FIG. 1.

Referring to FIG. 3, system 200' may be similar to system 200, but may include one or more diagnostic magnetic field sensing elements 250, 252, 254. Diagnostic magnetic field sensing element 250 may be positioned proximate to magnetic field sensing element 202 to detect magnetic field 108 and produce signal 250a representing magnetic field 108. Thus, signal 250a may match (e.g. be substantially similar to) signal 202a. Similarly, diagnostic magnetic field sensing element 252 may be positioned proximate to magnetic field sensing element 204 to detect magnetic field 110 and produce signal 252a representing magnetic field 110. Thus, signal 252a may be match (e.g. be substantially similar to) signal 204a. Similarly, diagnostic magnetic field sensing element 254 may be positioned proximate to magnetic field sensing element 206 to detect magnetic field 112 and produce signal 254a representing magnetic field 112. Thus, signal 254a may be match (e.g. be substantially similar to) signal 206a.

In embodiments, magnetic field sensing elements 202-206 may be manufactured (e.g. fabricated) using a similar process to respective diagnostic magnetic field sensing elements 250-254. As a result, magnetic field sensing elements 202-206 and diagnostic magnetic fields sensing elements 250-254 may share similar circuit properties, and may produce substantially similar output signals.

System 200' may include diagnostic processing circuit 220' which may be the same as or similar to diagnostic processing circuit 220. In contrast to diagnostic processing circuit 220 in FIG. 2 however, diagnostic processing circuit 220' may be coupled to receive signals 250a-254a from diagnostic magnetic field sensing elements 250-254, respectively.

Referring to FIG. 4, diagnostic processing circuit 400 may be the same as or similar to diagnostic processing circuit 220 and/or diagnostic processing circuit 220'. Diagnostic processing circuit 400 may include a signal processing path comprising amplifier 402 and ADC 404. The signal processing path may comprise other circuit elements (not shown) to process a received signal.

In embodiments, amplifier 402 may be manufactured or fabricated using the same, or a similar, process as amplifiers 208, 212, and 216. ADC 404 may be manufactured or fabricated using the same, or a similar, process as ADCs 210, 214, 218, and may have substantially the same circuit parameters. Thus, amplifiers 402 208, 212, and 216 should produce a like output signal when processing a like input signal. Similarly, ADCs 404, 210, 214, and 218 should produce a like output signal when processing a like input signal. It follows that the signal processing path of diagnostic circuit 400 may produce a like output signal to the signal processing paths of magnetic field sensors 114, 116, and 118, when processing a like input signal.

Diagnostic processing circuit 400 may also include a switch 406 selectively coupled to amplifier 402. Switch 406 may include a plurality of input terminals 408, 410, 412. In an embodiment, input terminals 408, 410, 412 may be coupled to receive signals 202a, 204a, and 206a from magnetic field sensing elements 202, 204, 206 (see FIG. 2) or coupled to receive signals 250a, 252a, and 254a (see FIG. 3). Switch 406 may have an input terminal to receive control signal 224a from control circuit 224. Control signal 224a may cause switch 406 to selectively couple one of input terminals 408, 410, or 412 to amplifier 402.

Referring to FIG. 5, and again to FIG. 2, in embodiments, system 200 may include respective coils, driven by a power source, that produce magnetic fields 108, 110, and 112. These may be so-called back-bias fields that can be used to detect movement of targets 102, 104, and 106 through the back-biase fields. Circuit 500 may include a coil 502 to produce such a back-bias magnetic field. Circuit 500 may also include a power source 504 that provides current to coil 502. Power source 504 may be an adjustable power source which can cause coil 502 to produce magnetic field with varying strengths. In an embodiment, power source 504 may cause coil 502 to produce a magnetic field having a first strength during normal operation of the magnetic field sensor (e.g. magnetic field sensor 114) and produce a magnetic field having a second strength during a diagnostic operation of the magnetic field sensor.

Referring to FIG. 6, circuit 600 may include a magnetic field sensing element 602, which may be the same as or similar to magnetic field sensing elements 202, 204, and/or 206. Circuit 600 may also include a variable power source 604 to provide power to magnetic field sensing element 602. Power source 604 may be an adjustable power source which can drive magnetic field sensing element 602 with varying voltages. In an embodiment, power source 604 may drive magnetic field sensing element 602 with one voltage during normal operation of the magnetic field sensor (e.g. magnetic field sensor 114) and drive magnetic field sensing element 602 with another voltage during a diagnostic operation of the magnetic field sensor. During diagnostic operation, power source 604 may drive magnetic field sensing element 602 with a voltage level sufficiently low so that magnetic field sensing element 602 produces an output signal that does not react to an external magnetic field. In this case, the output signal produced by magnetic field sensing element 602 may be, for example, a DC signal that is not altered if magnetic field sensing element 602 is in the presence of an external magnetic field.

Figure 7:
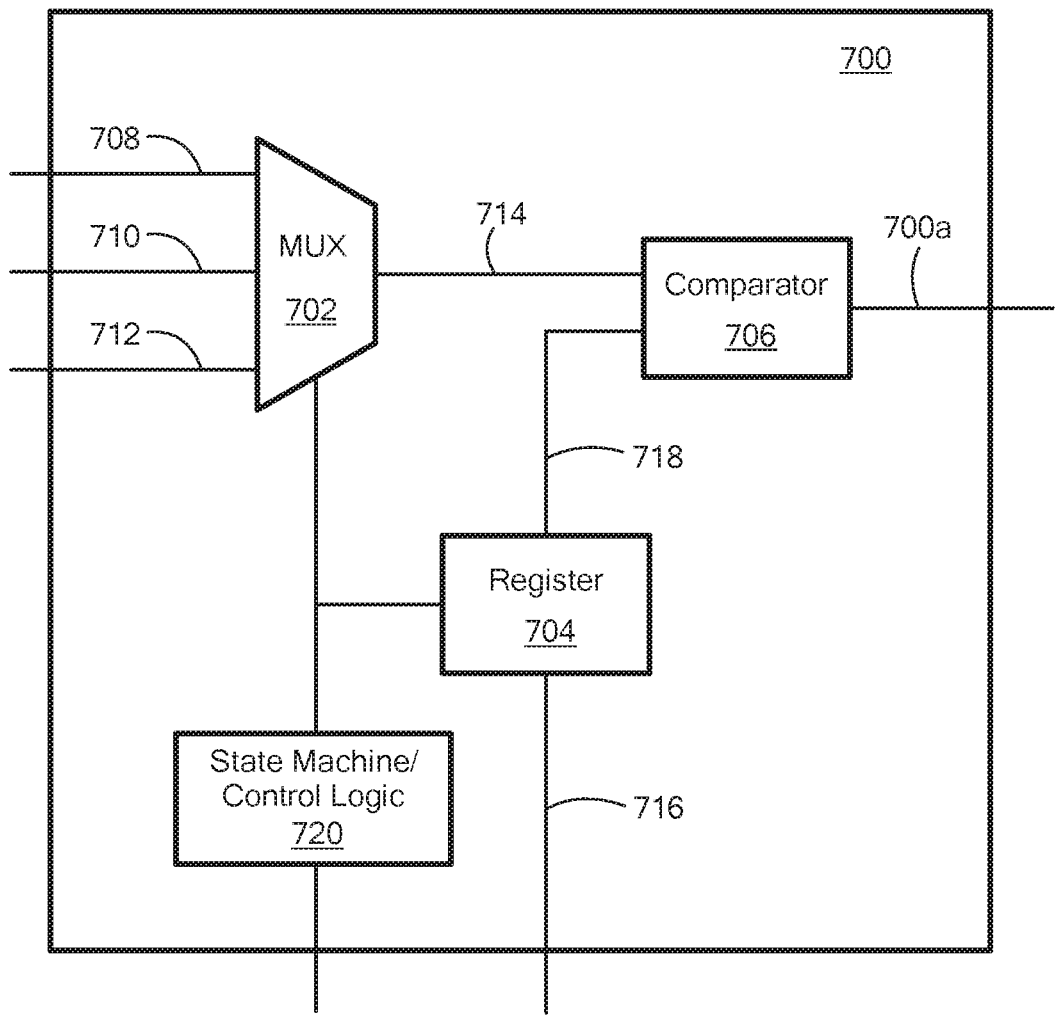
FIG. 7 is a block diagram of a logic circuit.

Referring to FIG. 7, logic circuit 700 may be the same as or similar to logic circuit 222. In embodiments, logic circuit 700 includes a switch 702, a bank of one or more registers 704, and a comparator 706. Switch 702 may be coupled to receive the output signals from the magnetic field sensors. For example, input terminals 708, 710, and 712 of switch 702 may be coupled to signals 114*a*, 116*a*, and 118*a* respectively. Switch output terminal 714 may be coupled to an input of comparator 706.

Registers 704 may be coupled to receive output signal 220*a* from diagnostic processing circuit 220 (or 220'). As noted above, signal 220*a* may be a time division multiplexed signal. Registers 704 may have an input terminal 716 coupled to receive signal 220*a*, and may be configured to store the signal 220*a* for each time period. For example, as described above, signal 220*a* may represent magnetic field 108 during one time period, magnetic field 110 during another time period, and magnetic field 112 during another time period. Registers 704 may store the value of signal 220*a* for each of these time periods. Registers 704 may also have an output terminal 718 coupled to a second input of comparator 706 to provide the stored values of signal 220*a* to comparator 706.

Control logic circuit 720 may be coupled to control switch 702 and registers 704. In an embodiment, logic circuit 720 may cause matching signals to be provided to comparator 706. For example, and referring also to FIG. 2, registers 704 may store a value of signal 220*a* that matches signal 114*a*. During one time period, logic circuit 720 may cause switch 702 to pass signal 114*a* through to comparator 706 and, at the same time, cause register 704 to provide a stored signal 220*a* (which was stored during a time that signal 220*a* matched signal 114*a*) to comparator 706. Comparator 706 may then compare the stored signal 220*a* to signal 114*a*. If the values do not match, circuit 700 may indicate an error in output signal 700*a*. Similarly, control logic circuit 720 may cause comparator 706 to receive signal 116*a* from switch 702 and receive a version of stored signal 220*a* that matches signal 118*a* from registers 704 during another time period, and cause comparator 706 to receive signal 118*a* from switch 702 and receive a stored version of signal 220*a* that matches signal 116*a* from registers 704 during another time period.

During each time period, circuit 700 may indicate whether the signals match. To determine if the signals match, comparator 706 may perform a digital comparison between the value stored in registers 704 and the value of signal 714. If the difference between the two signals is greater than a predetermined threshold value, a diagnostic fault may be indicated on signal 700*a*.

Registers 704 may be a bank of circular registers, general purpose registers, or any type of storage or memory that can store the value of signal 220*a*.

Figure 8:
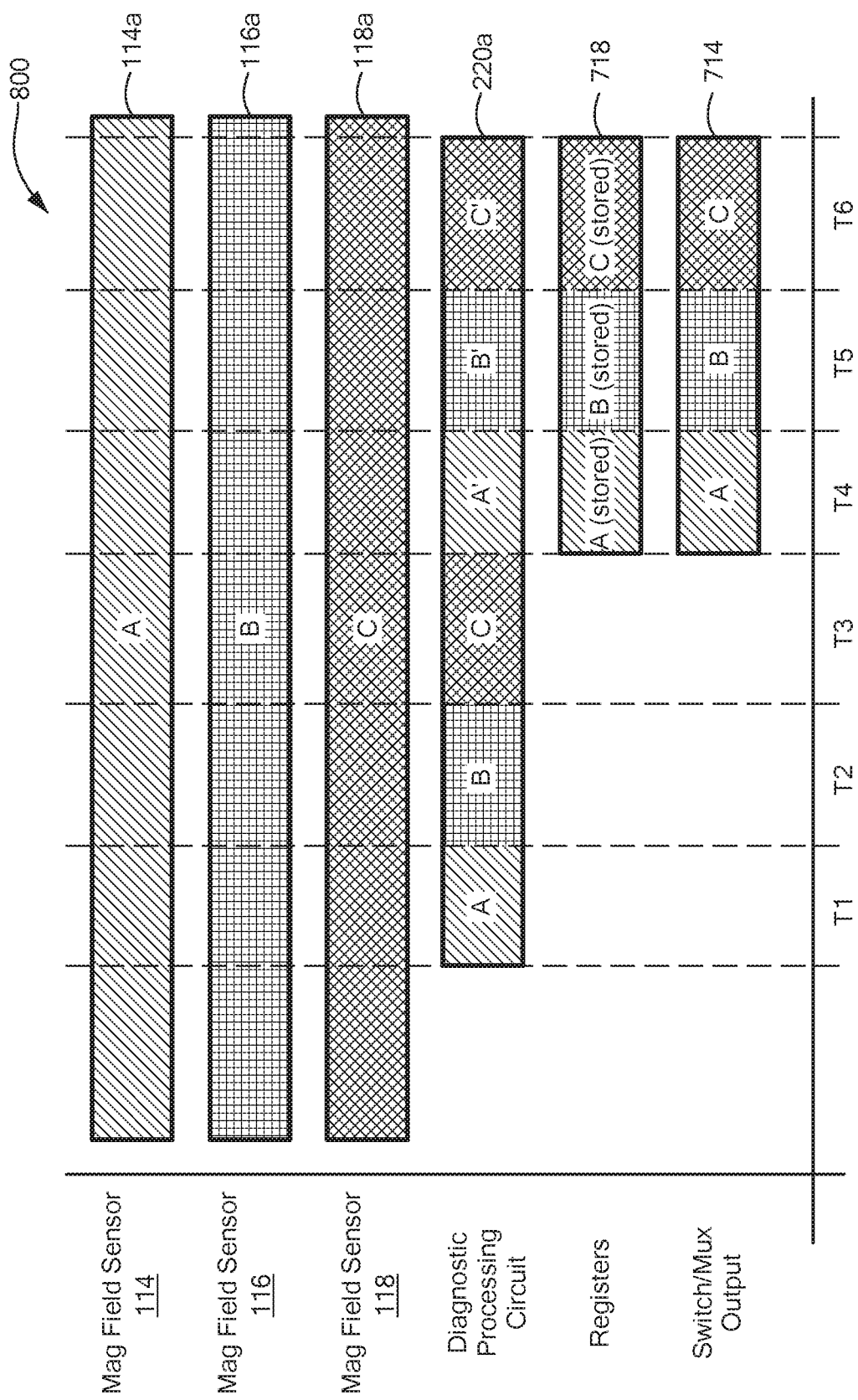
FIG. 8 is a timing diagram associated with the system of FIG. 2 and/or the system of FIG. 3.

Referring to FIG. 8, timing diagram 800 provides an example of timing of measurements associated with system 200. Reference will also be made to FIG. 3, FIG. 4, and FIG. 7. The various blocks shown in FIG. 8 may represent the output signals of various circuit portions described above. For example, the block labeled 114*a* represents signal 114*a* produced by magnetic field sensor 114, the block labeled 116*a* represents signal 116*a* produced by magnetic field sensor 116, and the block labeled 118*a* represents signal 118*a* produced by magnetic field sensor 118. The block labeled 220*a* represents the output of diagnostic processing circuit 220. The block labeled 718 represents the output of registers 704 (FIG. 7). And the block labeled 714 represents the output of switch 702 (FIG. 7).

As shown, during all time periods T1-T6, magnetic field sensor 114 produces signal 114*a*, magnetic field sensor 116 produces magnetic field sensor 116*a*, and magnetic field sensor 118 produces signal 116*a*.

During time T1, signal 202*a* may be processed by diagnostic processing circuit 220. Thus, the output signal 220*a* of diagnostic processing circuit 220 may match signal 114*a* during time T1 (as shown by pattern A). Also during time T1, signal 204*a* may be stored in registers 704. During time T2, signal 204*a* may be processed by diagnostic processing circuit 220. Thus, the output signal 220*a* of diagnostic processing circuit 220 may match signal 116*a* during time T2 (as shown by pattern B). Also during time T2, signal 204*a* may be stored in registers 704. During time T3, signal 206*a* may be processed by diagnostic processing circuit 220. Thus, the output signal 220*a* of diagnostic processing circuit 220 may match signal 118*a* during time T3 (as shown by pattern C). Also during time T3, signal 204*a* may be stored in registers 704.

During time T4, signal 718 (i.e. the output of registers 704) may reflect the value that was stored in registers 704 during time T1 (as shown by pattern A). Also during time T4, signal 114*a* may be passed through switch 702 and provided as output signal 714 (as shown by pattern A). Comparator 706 may receive these signals and provide an error signal if they do not match. During time T5, signal 718 (i.e. the output of registers 704) may reflect the value that was stored in registers 704 during time T2 (as shown by pattern B). Also during time T4, signal 116*a* may be passed through switch 702 and provided as output signal 714 (as shown by pattern B). Comparator 706 may receive these signals and provide an error signal if they do not match. During time T6, signal 718 (i.e. the output of registers 704) may reflect the value that was stored in registers 704 during time T3 (as shown by pattern C). Also during time T4, signal 118*a* may be passed through switch 702 and provided as output signal 714 (as shown by pattern A). Comparator 706 may receive these signals and provide an error signal if they do not match.

The sequence may continue in a like manner so that, with each time period, comparator 706 is comparing an output signal of one of the magnetic field sensors to a stored value of a like signal that was processed by diagnostic processing circuit 220.

One skilled in the art will recognize that the same or a similar timing diagram may apply to system 200' of FIG. 3.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

The invention claimed is:

1. An apparatus comprising:
   a first measurement circuit comprising:
      a first magnetic field sensing element to detect a measured magnetic field and produce a first signal representing the measured magnetic field; and
      a first signal processing circuit to process the first signal to produce a first processed signal;
   a second measurement circuit comprising:
      a second magnetic field sensing element to detect a measured magnetic field and produce a second signal representing the measured magnetic field; and
      a second signal processing circuit to process the second signal to produce a second processed signal;
   a diagnostic processing circuit coupled to receive the first signal and the second signal and configured to:
      process the first signal during a first time period to produce a first diagnostic signal; and
      process the second signal during a second time period to produce a second diagnostic signal; and
   a logic circuit coupled to receive the first processed signal, the second processed signal, the first diagnostic signal, and the second diagnostic signal to determine if an error is present.

2. The apparatus of claim 1 wherein one or more of the first and second magnetic field sensing elements comprise a Hall effect element or a magnetoresistive element.

3. The apparatus of claim 1 wherein the signal processing circuit of the first measurement circuit and/or the signal processing circuit of the second measurement circuit comprises an amplifier.

4. The apparatus of claim 1 wherein the signal processing circuit of the first measurement circuit and the signal processing circuit of the second measurement circuit each comprise an analog-to-digital converter.

5. The apparatus of claim 1 wherein:
   the first signal processing circuit comprises a first analog-to-digital converter and a first amplifier;
   the second signal processing circuit comprises a second analog-to-digital converter and a second amplifier;
   the diagnostic processing circuit comprises a diagnostic amplifier and a diagnostic analog-to-digital converter;
   wherein the first analog-to-digital converter, the second analog-to-digital converter, and the diagnostic analog-to-digital converter each have the same electrical parameters; and
   the first amplifier, the second amplifier, and the diagnostic amplifier each have the same electrical parameters.

6. The apparatus of claim 1 wherein the diagnostic processing circuit comprises:
   signal processing circuitry; and
   a switch coupled to receive the first signal and the second signal, and selectively direct the first and second signals to signal processing circuitry.

7. The apparatus of claim 6 further comprising a control circuit coupled to the switch and configured to time-multiplex the first signal and the second signal.

8. The apparatus of claim 1 further comprising one or more diagnostic magnetic field sensing elements to detect the magnetic field and produce a respective diagnostic signal.

9. The apparatus of claim 1 further comprising a magnetic source to produce the measured magnetic field.

10. The apparatus of claim 9 wherein the magnetic source comprises a coil and a coil driver.

11. An apparatus comprising:
    two or more measurement circuits, each measurement circuit of the two or more measurement circuits comprising:
       a magnetic field sensing element to detect a measured magnetic field and produce a signal representing the measured magnetic field; and
       at least one signal processing circuit to process the measured magnetic field signal;
    a diagnostic processing circuit coupled to receive the signal and generate a diagnostic output; and
    a logic circuit coupled to receive an output of each of the measurement circuits and the diagnostic output, and compare the output of each of the measurement circuits to the diagnostic output to determine if a fault is present in a respective measurement circuit.

12. The apparatus of claim 11 further comprising a coil to produce the measured magnetic field.

13. The apparatus of claim 12 wherein the diagnostic processing circuit comprises a diagnostic magnetic field sensing element to detect the measured magnetic field and provide a signal representing the measured magnetic field to the diagnostic processing circuit.

14. The apparatus of claim 11 wherein respective ones of the magnetic field sensing elements of the two or more measurement circuits are placed so that axes of maximum sensitivity of at least some of the magnetic field sensing elements have different directions.

15. The apparatus of claim 14 wherein the different directions are orthogonal directions.

16. An apparatus comprising:
    a first measurement circuit comprising:
       a first magnetic field sensing element to detect a measured magnetic field and produce a first signal representing the measured magnetic field; and
       at least one signal processing circuit to process the first signal;
    a second measurement circuit comprising:
       a second magnetic field sensing element to detect a measured magnetic field and produce a second signal representing the measured magnetic field; and
       at least one signal processing circuit to process the second signal;
    means for producing a diagnostic signal based on the measured magnetic field; and
    means for comparing the first and second signals to the diagnostic signal to determine whether a fault exists.

17. The apparatus of claim 16 further comprising means for time multiplexing the first signal and the second signal for delivery to a diagnostic circuit.

* * * * *